(12) United States Patent
Nogi et al.

(10) Patent No.: US 11,705,272 B2
(45) Date of Patent: Jul. 18, 2023

(54) COIL COMPONENT AND ELECTRONIC DEVICE

(71) Applicant: TAIYO YUDEN CO., LTD., Tokyo (JP)

(72) Inventors: Kenichiro Nogi, Takasaki (JP); Yoshio Hayashide, Wakayama-ken (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 749 days.

(21) Appl. No.: 16/570,744

(22) Filed: Sep. 13, 2019

(65) Prior Publication Data

US 2020/0105462 A1 Apr. 2, 2020

(30) Foreign Application Priority Data

Sep. 27, 2018 (JP) ................................ 2018-182903

(51) Int. Cl.
*H01F 1/24* (2006.01)
*H01F 1/26* (2006.01)
(Continued)

(52) U.S. Cl.
CPC ........... *H01F 27/292* (2013.01); *H01F 27/06* (2013.01); *H01F 27/2823* (2013.01);
(Continued)

(58) Field of Classification Search
CPC ... H01F 1/24; H01F 1/26; H01F 17/04; H01F 17/06; H01F 27/00; H01F 27/06;
(Continued)

(56) References Cited

U.S. PATENT DOCUMENTS 6,055,721 A * 5/2000 Mamada ............... H01F 17/045
336/212
6,076,253 A * 6/2000 Takayama ............. H01F 17/045
336/212
(Continued)

FOREIGN PATENT DOCUMENTS

JP    H04093115 U    8/1992
JP    H10199729 A    7/1998
(Continued)

OTHER PUBLICATIONS

A Notice of Reasons for Refusal issued by the Japanese Patent Office, dated Apr. 5, 2022, for Japanese counterpart application No. 2018-182903. (7 pages).

*Primary Examiner* — Xiaoliang Chen
(74) *Attorney, Agent, or Firm* — Law Office of Katsuhiro Arai

(57) ABSTRACT

A coil component includes: a coil embedded in a substrate body and having a winding part constituted by a wound conductor; wherein the substrate body has: a first region sandwiched between one end surface of the substrate body and a plane parallel with the one end surface and running through a portion of a first external electrode farthest away from the one end surface; a second region sandwiched between another end of the substrate body and a plane parallel with the another end surface and running through a portion of a second external electrode farthest away from the another end surface; and a third region between the first region and the second region; and the winding part is provided in the third region, and also in the first region where it is wound by one turn or more.

8 Claims, 9 Drawing Sheets

(51) Int. Cl.

| | | |
|---|---|---|
| H01F 17/04 | (2006.01) | |
| H01F 17/06 | (2006.01) | |
| H01F 27/00 | (2006.01) | |
| H01F 27/06 | (2006.01) | |
| H01F 27/28 | (2006.01) | |
| H01F 27/29 | (2006.01) | |
| H01F 27/33 | (2006.01) | |
| H01F 27/245 | (2006.01) | |
| H01F 41/00 | (2006.01) | |
| H01F 41/02 | (2006.01) | |
| H01F 41/04 | (2006.01) | |
| H01F 41/06 | (2016.01) | |
| H05K 3/18 | (2006.01) | |
| H01F 27/32 | (2006.01) | |
| H01F 41/12 | (2006.01) | |
| H05K 1/18 | (2006.01) | |

(52) U.S. Cl.
CPC ......... *H01F 27/327* (2013.01); *H01F 41/127* (2013.01); *H05K 1/181* (2013.01); *H01F 2027/065* (2013.01); *H05K 2201/1003* (2013.01)

(58) Field of Classification Search
CPC .......... H01F 27/28; H01F 27/29; H01F 27/33; H01F 27/245; H01F 27/292; H01F 27/295; H01F 27/327; H01F 27/2823; H01F 41/00; H01F 41/02; H01F 41/04; H01F 41/06; H01F 41/127; H05K 1/181; H05K 3/18; H05K 3/184
USPC ................. 336/83, 188, 192, 200, 212, 233; 438/696
See application file for complete search history.

(56) References Cited

U.S. PATENT DOCUMENTS

| | | | | |
|---|---|---|---|---|
| 6,104,272 | A * | 8/2000 | Yamamoto | H01F 17/03 336/200 |
| 6,189,202 | B1 * | 2/2001 | Masuda | H01F 41/064 336/212 |
| 6,377,151 | B1 * | 4/2002 | Takayama | H01F 41/06 336/83 |
| 6,560,851 | B1 * | 5/2003 | Yamamoto | H01F 17/045 336/212 |
| 6,725,525 | B1 * | 4/2004 | Shikama | H01F 27/245 336/83 |
| 6,950,006 | B1 * | 9/2005 | Shikama | H01F 27/022 336/200 |
| 2004/0082179 | A1 * | 4/2004 | Saito | C23C 18/1605 438/696 |
| 2007/0176190 | A1 | 8/2007 | Takayama | |
| 2012/0286917 | A1 | 11/2012 | Uchida et al. | |
| 2013/0127576 | A1 | 5/2013 | Hachiya et al. | |
| 2014/0062643 | A1 | 3/2014 | Hahn et al. | |
| 2014/0306789 | A1 * | 10/2014 | Hirai | H01F 17/045 336/188 |
| 2015/0371755 | A1 * | 12/2015 | Im | H01F 27/2804 336/200 |
| 2016/0225511 | A1 * | 8/2016 | Yoon | H01F 27/022 |
| 2016/0343486 | A1 * | 11/2016 | Kim | H01F 41/0246 |
| 2018/0294088 | A1 | 10/2018 | Kato | |

FOREIGN PATENT DOCUMENTS

| | | |
|---|---|---|
| JP | 2000106312 A | 4/2000 |
| JP | 2004342814 A | 12/2004 |
| JP | 2007027535 A | 2/2007 |
| JP | 2013110171 A | 6/2013 |
| JP | 2014045165 A | 3/2014 |
| JP | 2014236112 A | 12/2014 |
| WO | 2010150602 A1 | 12/2010 |
| WO | 2017130720 A1 | 8/2017 |

* cited by examiner

COIL COMPONENT AND ELECTRONIC DEVICE

CROSS-REFERENCE TO RELATED APPLICATIONS

The present application claims priority to Japanese Patent Application No. 2018-182903, filed Sep. 27, 2018, the disclosure of which is incorporated herein by reference in its entirety including any and all particular combinations of the features disclosed therein.

BACKGROUND

Field of the Invention

The present invention relates to a coil component and an electronic device.

Description of the Related Art

Coil components, constituted in such a way that a coil is embedded in a substrate body while external electrodes are provided on the surface of the substrate body and connected electrically to the coil, are known. For example, coil components are known that comprise external electrodes which are provided on, among the surfaces of the substrate body, a pair of surfaces intersecting roughly orthogonally with the surfaces intersecting with the coil axis, and which are connected to the coil at this pair of surfaces (refer to Patent Literature 1, for example). For example, coil components are known that comprise external electrodes which are provided on, among the surfaces of the substrate body, a pair of surfaces intersecting with the coil axis, and which are connected to the coil at this pair of surfaces (refer to Patent Literatures 2 and 3, for example).

BACKGROUND ART LITERATURES

[Patent Literature 1] Japanese Patent Laid-open No. H 10-199729
[Patent Literature 2] Japanese Patent Laid-open No. 2004-342814
[Patent Literature 3] International Patent Laid-open No. 2017/130720

SUMMARY

The present invention is a coil component comprising: a coil having a winding part constituted by a wound conductor; a substrate body formed in a manner containing metal magnetic grains, which has the coil embedded in it and is shaped roughly as a rectangular solid having a first surface roughly parallel with the coil axis of the coil and a pair of second surface and third surface intersecting roughly orthogonally with the first surface and being roughly orthogonal to the coil axis; a first external electrode provided in a manner extending at least from the first surface, to the second surface, of the substrate body, and connected to the coil at the second surface; and a second external electrode provided in a manner extending at least from the first surface, to the third surface, of the substrate body, and connected to the coil at the third surface; wherein the substrate body has: a first region sandwiched between the second surface and a virtual face which runs through the portion of the first external electrode farthest away from the second surface and is parallel with the second surface; a second region sandwiched between the third surface and a virtual face which runs through the portion of the second external electrode farthest away from the third surface and is parallel with the third surface; and a third region between the first region and the second region; and the winding part is provided in the third region, and also in the first region where it is wound by one turn or more.

The present invention is an electronic device comprising: the aforementioned coil component; and a circuit board on which the coil component has been mounted.

BRIEF DESCRIPTION OF THE DRAWINGS

FIG. 1A is a perspective view, while
FIG. 5A is a perspective side view of the coil component pertaining to Example 2, while
FIG. 6A is a perspective side view of the coil component pertaining to Example 3, while

DESCRIPTION OF THE SYMBOLS

Figure 1A:
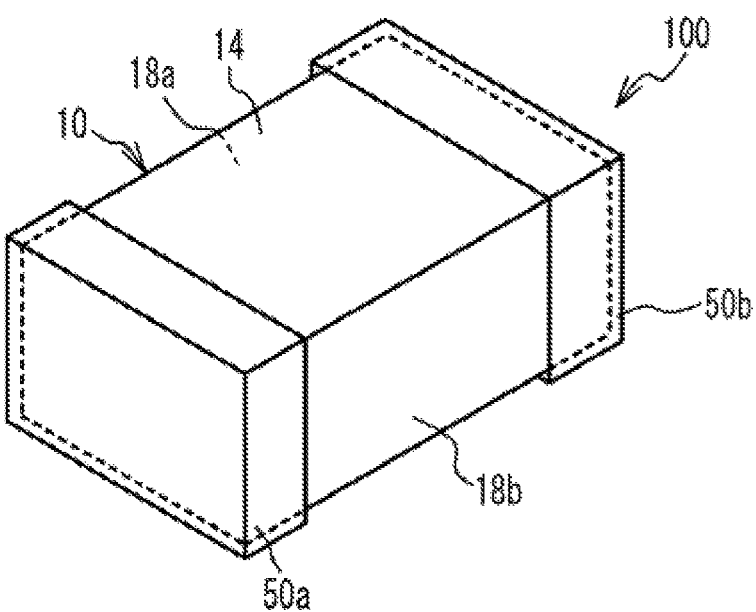

10 Substrate body
12 Bottom face
14 Top face
16a, 16b End face
18a, 18b Side face
20, 22, 24 Region
30 Coil
32 Winding part
34a, 34b Lead part
36 Winding segment
38 Proximate part
40 Shortest distance part
42 Conductor pattern
44 Through hole pattern
50a, 50b External electrode
60, 62 Virtual face
80 Circuit board
82 Electrode
84 Solder
90 Portion
100, 200, 300, 400, 410, 600, 700 Coil component
500 Electronic device

DETAILED DESCRIPTION OF EMBODIMENTS

Examples of the present invention are explained below by referring to the drawings.

Example 1

Figure 1B:
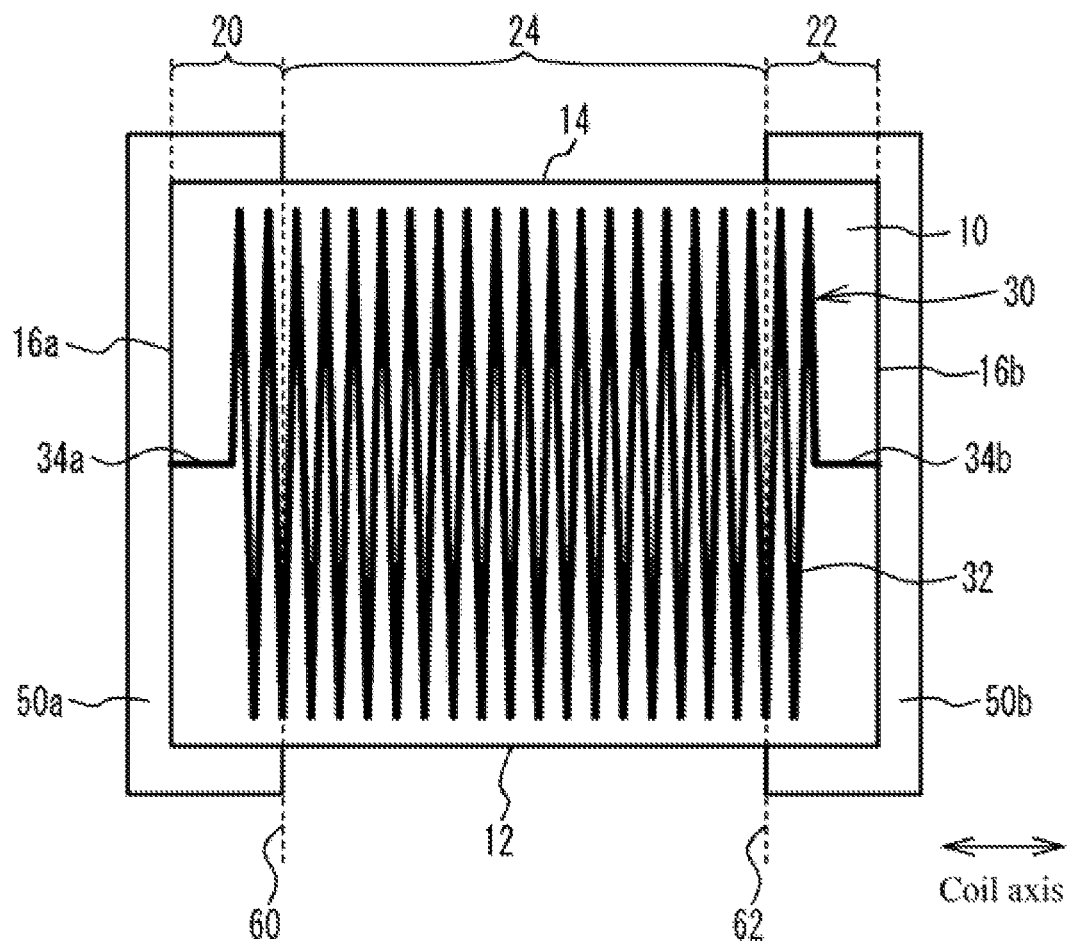
FIG. 1B is a perspective side view, of the coil component pertaining to Example 1

FIG. 1A is a perspective view, while FIG. 1B is a perspective side view, of the coil component pertaining to Example 1. As shown in FIGS. 1A and 1B, the coil component 100 in Example 1 comprises a substrate body 10, a coil 30, and external electrodes 50a, 50b.

The coil 30 is embedded in the substrate body 10. The coil 30 has a winding part 32 constituted by a radially wound conductor, and lead parts 34a, 34b constituted by this conductor as it is led out from both ends of the winding part 32. The conductor is formed by, for example, copper, aluminum, nickel, silver, platinum, palladium, or other metal material, or alloy material containing the foregoing. The conductor has no insulating film covering its periphery, and is directly contacting the substrate body 10. In other words, the coil 30 is formed in such a way that its conductor is exposed to the surface. Because no insulating film exists on the surface of the conductor constituting the coil 30, the cross-section area of the conductor can be increased and its resistance can be lowered. The coil 30 has winding segments that are counted in units of windings, constituted by the winding part 32 which is wound by a prescribed number of times. Depending on the number of windings, there may be a portion constituting less than one winding; however, such fractional portion is handled as one winding segment even though it constitutes less than one winding. The concept of the number of windings and how it relates to the winding segments will be described later.

The substrate body 10 is shaped roughly as a rectangular solid, and has a bottom face 12, a top face 14, a pair of end faces 16a, 16b, and a pair of side faces 18a, 18b. The bottom face 12, top face 14, and side faces 18a, 18b are faces running roughly parallel with the coil axis. The end faces 16a, 16b are faces running roughly orthogonal to the coil axis. The end faces 16a, 16b and side faces 18a, 18b intersect roughly orthogonally with the bottom face 12 and top face 14. It should be noted that "roughly parallel" and "roughly orthogonal(ly)" do not only mean completely parallel or orthogonal, but they also include tilting from parallel or orthogonal by manufacturing error or so. Also, "shaped roughly as a rectangular solid" does not only mean a perfect rectangular solid shape, but it also includes, for example, a rectangular solid shape whose apexes are each rounded, whose ridges (boundaries of the faces) are each rounded, whose faces are each curved, or the like. In this disclosure, generally, the term "roughly" refers to a manner accepting a manufacturing error, unavoidable error, immaterial error, industrially acceptable error, etc.

The substrate body 10 is formed in a manner containing metal magnetic grains. For example, the substrate body 10 is formed by a resin that contains metal magnetic grains. The metal magnetic grains may be, for example, magnetic grains constituted by Fe—Si—Cr, Fe—Si—Al, Fe—Si—Cr—Al, or other soft magnetic alloy material, Fe, Ni, or other magnetic metal material, amorphous magnetic metal material, or nanocrystal magnetic metal material, and the like. The resin may be epoxy resin, silicone resin, phenolic resin, or other thermosetting resin, or polyamide resin, fluororesin, or other thermoplastic resin. For the resin, a resin whose heat resistance is higher than the heat resistance temperature of the coil component 100 is selected. Also, the metal magnetic grains may have been insulation-treated on their surface. If the metal magnetic grains have been insulation-treated on their surface, the substrate body 10 may not contain resin and instead, it may be formed by the bonding of the insulating films formed on the surfaces of the metal magnetic grains.

The lead part 34a of the coil 30 is led out from one end of the winding part 32 to the end face 16a of the substrate body 10. The lead part 34b of the coil 30 is led out from the other end of the winding part 32 to the end face 16b of the substrate body 10. Because the lead parts 34a, 34b are led out to the end faces 16a, 16b, the number of turns in the winding part 32 can be increased, and consequently the inductance can be increased. Preferably the lead parts 34a, 34b are led out from the winding part 32 linearly to the end faces 16a, 16b. As they are led out linearly, the lead parts 34a, 34b can have shorter lead distances and the resistance of the coil 30 can be lowered. It should be noted that the lead parts 34a, 34b may not be provided and the winding part 32 may start from the end faces 16a, 16b of the substrate body 10. If the coil 30 is connected to the external electrodes 70a, 70b at the end faces 16a, 16b of the substrate body 10, the inductance can be increased.

The external electrodes 50a, 50b are external terminals for surface mounting, provided on the surface of the substrate body 10. The external electrode 50a extends from the bottom face 12, via the end face 16a, to the top face 14, while covering parts of the side faces 18a, 18b, of the substrate body 10. The external electrode 50b extends from the bottom face 12, via the end face 16b, to the top face 14, while covering parts of the side faces 18a, 18b, of the substrate body 10. In other words, the external electrodes 50a, 50b are five-sided electrodes covering five faces of the substrate body 10. It should be noted that the external electrode 50a only needs to extend from the bottom face 12, to the end face 16a, of the substrate body 10, which means that it may be, for example, a three-sided electrode extending from the bottom face 12, via the end face 16a, to the top face 14, of the substrate body 10, or a two-sided electrode extending from the bottom face 12 to the end face 16a. The same is true with the external electrode 50b which may be a three-sided electrode or two-sided electrode so long as it extends at least from the bottom face 12, to the end face 16b, of the substrate body 10.

The external electrode 50a is connected, at the end face 16a, to the lead part 34a which is led out from one end of the winding part 32 to the end face 16a of the substrate body 10. The external electrode 50b is connected, at the end face 16b, to the lead part 34b which is led out from the other end of the winding part 32 to the end face 16b of the substrate body 10.

The external electrodes 50a, 50b are formed by multiple metal layers, for example. For example, the external electrodes 50a, 50b have a layer structure comprising a bottom layer formed by copper, aluminum, nickel, silver, platinum, palladium, or other metal material, or alloy material containing the foregoing, a middle layer formed by silver or conductive resin containing silver, and a top layer being a nickel and/or tin-plating layer. The layer constitution of the external electrodes 50a, 50b is not limited to the one comprising the layers illustrated; instead, an intermediate layer may be provided between each adjacent pair of layers, or a topmost layer may be provided on top of the top layer, for example.

The substrate body 10 is divided into three regions in a direction roughly parallel with the coil axis. The first region is a region 20 sandwiched between the end face 16a and a virtual face 60 which runs through the portion of the external electrode 50a farthest away from the end face 16a and is parallel with the end face 16a. The second region is a region 22 sandwiched between the end face 16b and a virtual face 62 which runs through the portion of the external electrode 50b farthest away from the end face 16b and is parallel with the end face 16b. The third region is a region 24 between the regions 20, 22.

The winding part 32 of the coil 30 extends from the region 20, via the region 24, to the region 22, and is wound by one turn or more in the region 20 and region 22. It should be noted that the winding part 32 need not be wound by one turn or more in both the region 20 and region 22; instead, it may be wound by one turn or more in at least one of the region 20 and region 22.

Now, one example of how the coil component 100 in Example 1 is manufactured, is explained. First, a coil 30 having a winding part 32 and lead parts 34a, 34b is prepared. The coil 30 is placed in a die, and a resin containing metal magnetic grains is poured into the die using a dispenser, etc. Then, the resin that has been poured into the die is cured to form a substrate body 10 in which the coil 30 is embedded. Next, external electrodes 50a, 50b are formed on the surface of the substrate body 10. External electrodes 50a, 50b are formed by paste-printing, plating, sputtering or other method used in thin-film processes. Based on the method described above, the coil component 100 in Example 1 is formed.

Figure 2:
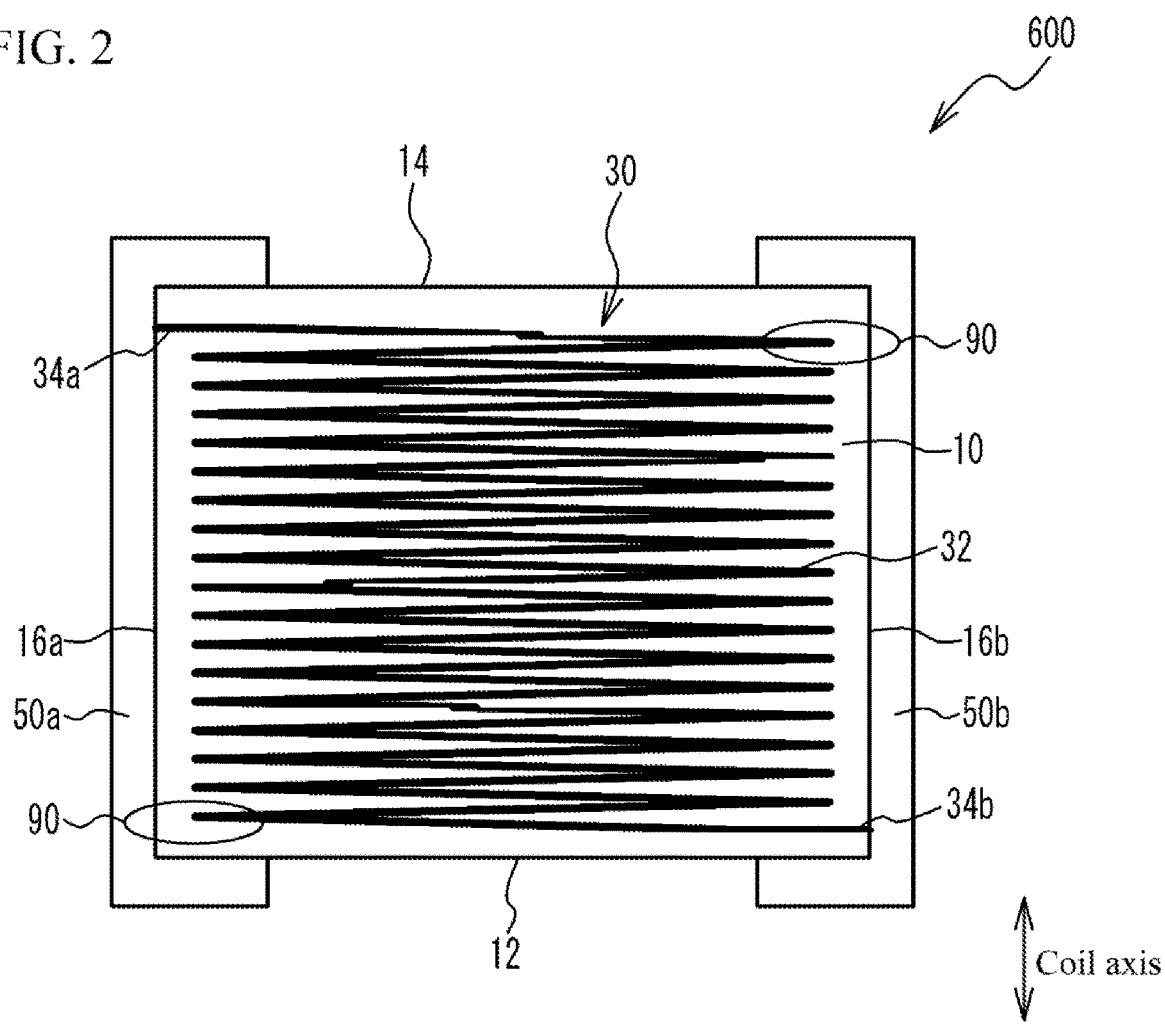
FIG. 2 is a perspective side view of the coil component pertaining to Comparative Example 1.

Next, the coil components pertaining to the comparative examples are explained. FIG. 2 is a perspective side view of the coil component pertaining to Comparative Example 1. With the coil component 100 in Example 1, the winding part 32 of the coil 30 is wound in a manner extending between the end faces 16a, 16b of the substrate body 10, as shown in FIG. 1B; with the coil component 600 in Comparative Example 1, on the other hand, the winding part 32 of the coil 30 is wound in a manner extending between the bottom face 12 and top face 14 of the substrate body 10, as shown in FIG. 2. The remaining constitutions are the same as those in Example 1 and therefore not explained.

According to Comparative Example 1, the winding part 32 of the coil 30 is wound in a manner approaching the external electrode 50b from the lead part 34a connected to the external electrode 50a, and it is also wound in a manner approaching the external electrode 50a from the lead part 34b connected to the external electrode 50b. This means that, when high voltage is applied between the external electrodes 50a, 50b, for example, portions 90 of higher electrical potential difference are created between the winding part 32 and the external electrodes 50a, 50b. The substrate body 10 is formed in a manner containing metal magnetic grains. Since metal magnetic grains are lower in insulating property than the conventionally used ferrite grains, the substrate body 10 containing metal magnetic grains has lower dielectric strength than a substrate body containing the conventionally used ferrite grains. As a result, the substrate body 10 may experience dielectric breakdown at the portions 90 of higher electrical potential difference between the winding part 32 and the external electrodes 50a, 50b, thereby causing the winding part 32 to short with the external electrodes 50a, 50b. Particularly when coil components are becoming smaller of late, the trend is for the spacing between the winding part 32 and the external electrodes 50a, 50b to decrease, which makes the substrate body 10 vulnerable to dielectric breakdown between the winding part 32 and the external electrodes 50a, 50b. Also, coil components are being used in large-current, high-voltage applications and, in this sense, too, the substrate body 10 is vulnerable to dielectric breakdown between the winding part 32 and the external electrodes 50a, 50b.

To make dielectric breakdown less likely in the substrate body 10 between the winding part 32 and the external electrodes 50a, 50b, one idea is to reduce the outer diameter of the winding part 32 and widen the spacing between the winding part 32 and the external electrodes 50a, 50b. This, however, reduces the core area of the winding part 32 of the coil 30 and lowers the inductance (L-value).

Figure 3:
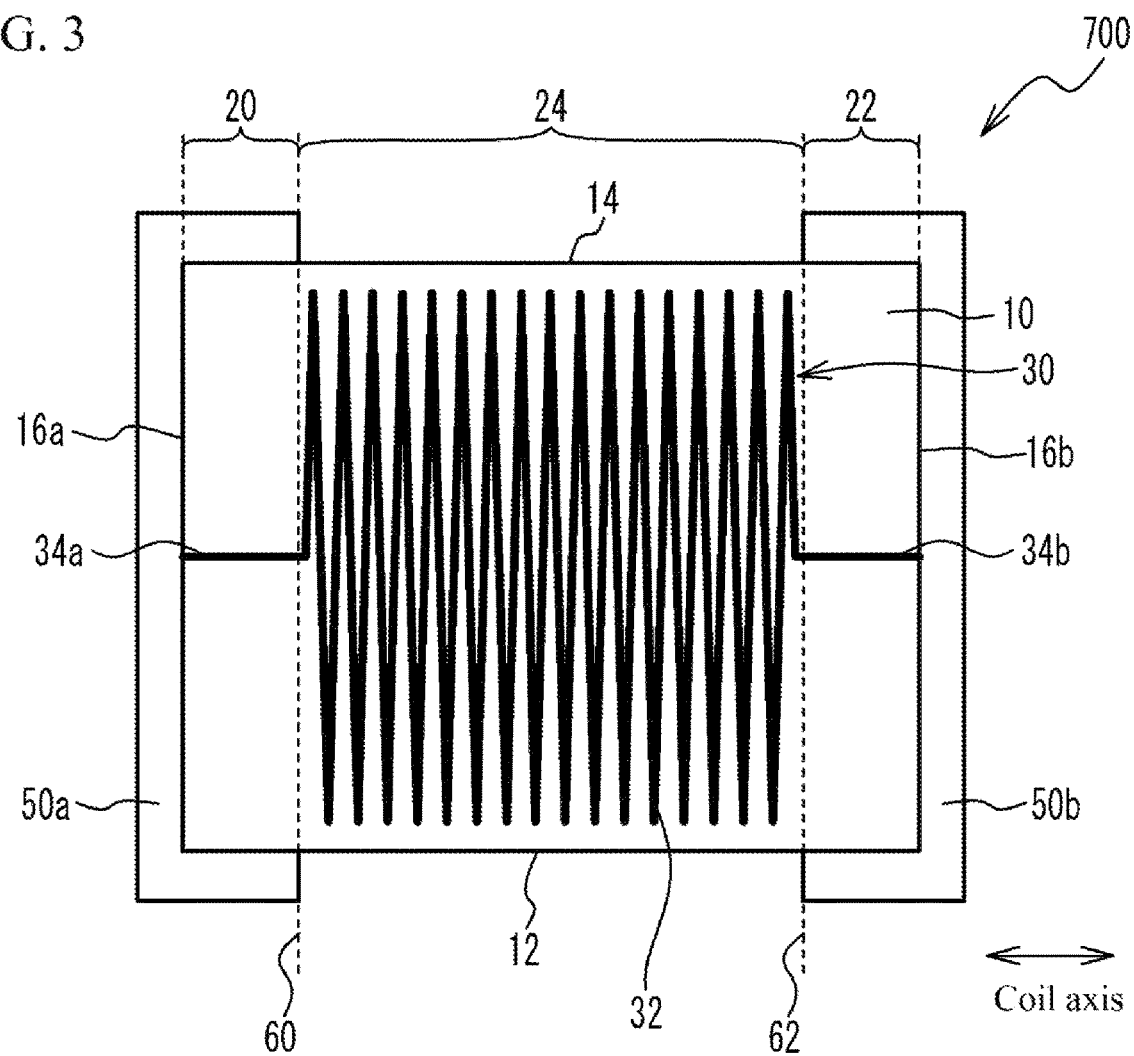
FIG. 3 is a perspective side view of the coil component pertaining to Comparative Example 2.

FIG. 3 is a perspective side view of the coil component pertaining to Comparative Example 2. As shown in FIG. 3, the coil component 700 in Comparative Example 2 is similar to the coil component 100 in Example 1 in that the winding part 32 of the coil 30 is wound in a manner extending between the end faces 16a, 16b of the substrate body 10, except that it is not provided in the regions 20, 22 of the substrate body 10. The remaining constitutions are the same as those in Example 1 and therefore not explained.

According to Comparative Example 2, the winding part 32 of the coil 30 does not immediately approach the external electrode 50b as it is wound out of the lead part 34a connected to the external electrode 50a, nor does it immediately approach the external electrode 50a as it is wound out of the lead part 34b connected to the external electrode 50b. This means that, even when high voltage is applied between the external electrodes 50a, 50b, for example, portions of higher electrical potential difference are not created easily between the winding part 32 and the external electrodes 50a, 50b. As a result, dielectric breakdown does not occur easily in the substrate body 10 between the winding part 32 and the external electrodes 50a, 50b.

However, in Comparative Example 2, the winding part 32 is not provided in the regions 20, 22 of the substrate body 10. This may result in a lower inductance, thus making it difficult to obtain the desired inductance. As coil components are becoming smaller of late, for example, the trend is for the highest achievable design inductance to decrease; in Comparative Example 2, therefore, the inductance may decrease further, thus making it difficult to obtain the desired inductance.

According to Example 1, the winding part 32 of the coil 30 is provided in the region 24, and also wound by one turn or more in the regions 20, 22, of the substrate body 10, as shown in FIG. 1B. This prevents dielectric breakdown in the substrate body 10 between the winding part 32 and the external electrodes 50a, 50b, while increasing the inductance so that the desired inductance can be achieved. Also, preventing dielectric breakdown in the substrate body 10 between the winding part 32 and the external electrodes 50a, 50b makes it possible to increase the outer diameter of the winding part 32. Accordingly, the inductance can be increased from this respect, as well. It should be noted that, while Example 1 illustrated an example where the winding part 32 was wound by one turn or more in both of the regions 20, 22 of the substrate body 10, it only needs to be wound by one turn or more in at least the region 20 between the regions 20, 22. Also, regarding the number of turns in the regions 20, 22, the winding part 32 may be wound by two turns or more, or it may be wound by three turns or more, from the viewpoint of increasing the inductance.

Also, according to Example 1, the lead parts 34a, 34b are led out from both ends of the winding part 32 to the end faces 16a, 16b which are faces roughly orthogonal to the coil axis of the substrate body 10. This way, the winding part 32 can have more turns compared to when the lead parts 34a, 34b are led out to a face (such as the bottom face 12) which is roughly parallel with the coil axis of the substrate body 10, and therefore the inductance can be increased. It should be noted that the lead parts 34a, 34b may not be provided and the winding part 32 may start from the end faces 16a, 16b of the substrate body 10. If the coil 30 is connected to the external electrodes 70a, 70b at the end faces 16a, 16b of the substrate body 10, the inductance can be increased.

Now, providing the winding part 32 in the region 20 of the substrate body 10 presents a concern that, if the winding part 32 becomes too close to those portions of the external electrode 50a that are roughly parallel with the coil axis, or specifically portions of the external electrode 50a provided on the bottom face 12, top face 14 and side faces 18a, 18b, dielectric breakdown may occur in the substrate body 10 between the winding part 32 and the external electrode 50a. The same applies when the winding part 32 is provided in the region 22 of the substrate body 10. Accordingly, the spacing between the winding part 32 and the portions of the external electrodes 50a, 50b that are roughly parallel with the coil axis-which can prevent dielectric breakdown in the substrate body 10 between the winding part 32 and the external electrodes 50a, 50b—is explained.

Figure 4:
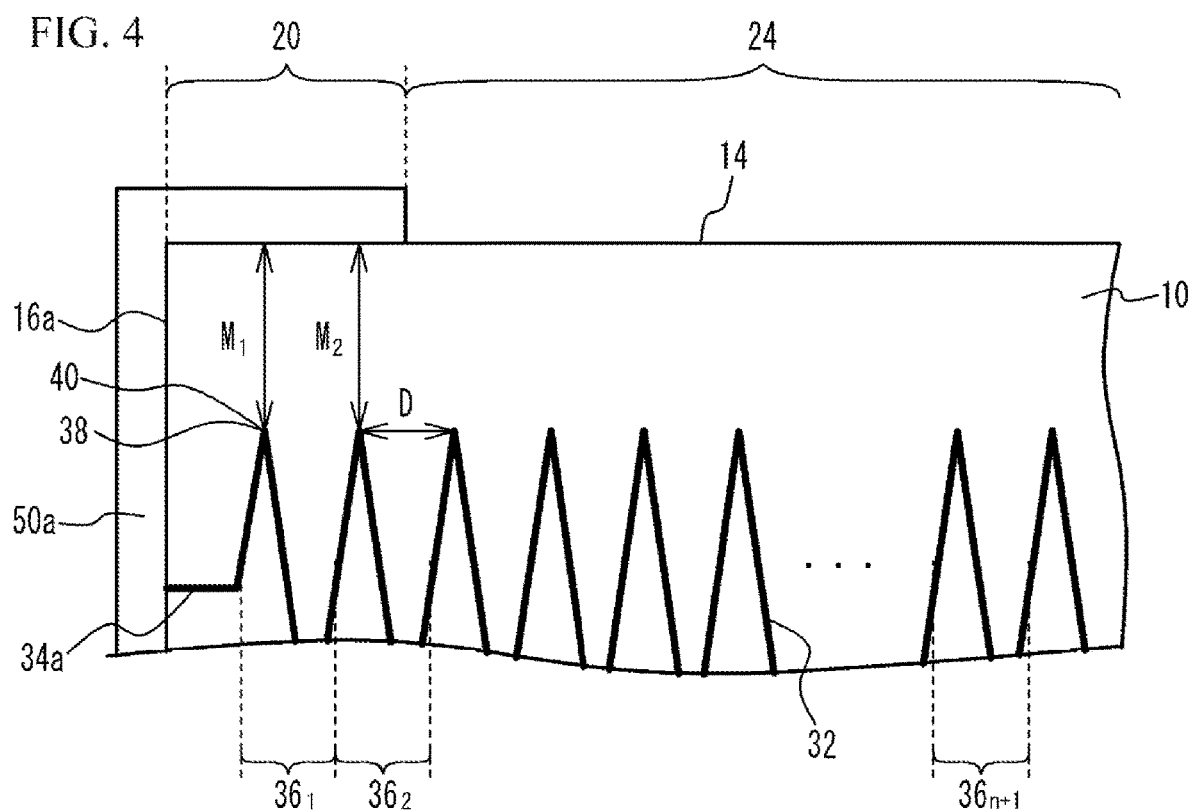
FIG. 4 is a drawing for explaining the winding part of the coil in Example 1.

FIG. 4 is a drawing for explaining the winding part of the coil in Example 1. It should be noted that FIG. 4 is also used to explain how to count the number of windings in the winding part of the coil, and the relationship between the number of windings and the winding segments. As shown in FIG. 4, the number of windings (number of turns) in the winding part 32 can be counted from the portion connected to the lead part 34a on the end face 16a side of the substrate body 10, as the starting point (i.e., the point of the wound conductor connected to the lead part is used as the starting point, and the central angle formed by the starting point and a given reference point and lines from them to the axis of the coil, as viewed in the direction of the axis of the coil, can be used to count the number of windings (turns), i.e., one turn starts from a point of each winding at the central angle and ends at a point of an adjacent winding at the central angle as viewed in the direction of the axis of the coil). The section where the number of turns is n or more but less than (n+1), as counted from the starting point which is the portion of the winding part 32 connected to the lead part 34a, is called the (n+1)th winding segment and expressed as winding segment $36_{n+1}$ (n is an integer of 0 or greater). The winding part 32 has multiple winding segments 36 (winding segments $36_1$ to $36_{n+1}$). To be specific, the section of the winding part 32 where the number of turns is 0 or more but less than 1 represents the first winding segment (winding segment $36_1$), while the section where the number of turns is 1 or more but less than 2 represents the second winding segment (winding segment $36_2$). The section where the number of turns is n or more but less than (n+1) represents the (n+1)th winding segment (winding segment $36_{n+1}$). Although the winding segments are separated into single turns, there are exceptions where a winding segment constitutes less than one turn.

While the portion connected to the lead part 34a is used as the starting point of the winding part 32 in FIG. 4, the portion connected to the lead part 34b may be used as the starting point of the winding part 32. Depending on whether to use the portion connected to the lead part 34a or portion connected to the lead part 34b as the starting point of the winding part 32, the method for counting the number of turns will vary and so will the method for counting the winding segments. When the spacing between the portion of the external electrode 50a roughly parallel with the coil axis and the winding part 32 of the coil 30 is defined, the number of turns and winding segments will be counted by using the portion connected to the lead part 34a as the starting point of the winding part 32. Meanwhile, when the spacing between the portion of the external electrode 50b roughly parallel with the coil axis and the winding part 32 of the coil 30 is defined, the number of turns and winding segments will be counted by using the portion connected to the lead part 34b as the starting point of the winding part 32.

Also, the lead parts 34a, 34b may not be provided and the winding part 32 may start from the end faces 16a, 16b of the substrate body 10. In this case, the portion connected to the end face 16a or 16b of the substrate body 10 may be used as the starting point of the winding part 32.

It should be noted that, while the following explanations are based on an example of the spacing between the portion of the external electrode 50a roughly parallel with the coil axis and the winding part 32 of the coil 30, the same applies to the spacing between the portion of the external electrode 50b roughly parallel with the coil axis and the winding part 32 of the coil 30.

The multiple winding segments 36 have multiple proximate parts 38 close to the bottom face 12, top face 14 and side faces 18a, 18b of the substrate body 10 that are roughly parallel with the coil axis. In other words, the multiple winding segments 36 have the shortest spacings from the bottom face 12, top face 14 and side faces 18a, 18b of the substrate body 10, at their proximate parts 38.

Now, the spacing, in a direction parallel with the coil axis, between a pair of adjacent winding segments among the multiple winding segments 36 is given by D. Also, when the location along the multiple winding segments 36 where its distance from the portion of the external electrode 50a roughly parallel with the coil axis is the shortest is defined as a shortest distance part 40, then at least one of the multiple proximate parts 38 corresponds to the shortest distance part 40. In FIG. 4, the proximate part 38 close to the top face 14 of the substrate body 10 is defined as the shortest distance part 40 whose distance from the portion of the external electrode 50a roughly parallel with the coil axis is the shortest. The shortest distance between the shortest distance part 40 of the Xth winding segment (winding segment $36_X$ (X is an integer of 1 or greater)) among the multiple winding segments 36, and the portion of the external electrode 50a roughly parallel with the coil axis, is given by $M_X$. In this case, preferably the relationship of $M_X > X \times D$ is satisfied.

Specifically, at the first winding segment (winding segment $36_1$), the shortest distance $M_1$ between the shortest distance part 40 and the portion of the external electrode 50a roughly parallel with the coil axis satisfies the relationship of $M_1 > 1 \times D$. At the second winding segment (winding segment $36_2$), the shortest distance $M_2$ between the shortest distance part 40 and the portion of the external electrode 50a roughly parallel with the coil axis satisfies the relationship of $M_2 > 2 \times D$.

As described above, preferably the shortest distance $M_x$ between the Xth winding segment (winding segment $36_x$) among the multiple winding segments 36, and the portion of the external electrode 50a roughly parallel with the coil axis, satisfies the relationship of $M_x > X \times D$. This way, dielectric breakdown in the substrate body 10 between the winding part 32 and the external electrode 50a can be prevented. This is explained by the following reason. To be specific, the spacing D between each adjacent pair of winding segments is determined in such a way that dielectric breakdown does not occur in the substrate body 10 between the adjacent winding segments. Also, the length of the lead part 34a is determined in such a way that dielectric breakdown does not occur in the substrate body 10 between the first winding segment (winding segment $36_1$) and the portion of the external electrode 50a positioned on the end face 16a of the substrate body 10. Accordingly, satisfying the relationship of $M_X > X \times D$ prevents dielectric breakdown from occurring in the substrate body 10 between the winding part 32 and the external electrode 50a in a direction roughly orthogonal to the coil axis, and as a result, dielectric breakdown in the substrate body 10 between the winding part 32 and the external electrode 50a can be prevented.

Also, among the multiple winding segments 36, the last winding segment whose shortest distance part 40 is positioned inside the region 20 is defined as the Zth winding segment (winding segment $36_Z$ (Z is an integer of 1 or greater)). In this case, the Zth winding segment is such that dielectric breakdown in the substrate body 10 between it and the external electrode 50a can be prevented when the shortest distance $M_Z$ between the shortest distance part 40 and the portion of the external electrode 50a roughly parallel with the coil axis satisfies $M_Z < Z \times D$. It should be noted that, in FIG. 4, the Zth winding segment corresponds to the second winding segment (winding segment $36_2$). In this case, preferably the shortest distances $M_1$ to $M_Z$, each between the shortest distance part 40 of one of the first winding segment to the Zth winding segment and the portion of the external electrode 50a roughly parallel with the coil axis, are roughly constant, with the shortest distance $M_Z$ of the Zth winding segment satisfying $M_Z > Z \times D$. This way, the winding part 32 can have roughly the same outer diameter at the first winding segment through the Zth winding segment, while preventing dielectric breakdown in the substrate body 10 between the winding part 32 and the external electrode 50a. As a result, the ease of manufacturing the coil 30 can be improved. More preferably the winding part 32 is wound to roughly the same outer diameter at one end through the other end. This way, the ease of manufacturing the coil 30 can be improved further. It should be note that "roughly constant" and "roughly the same" do not only mean completely constant or the same, but they also include differences by manufacturing error or so. (The same applies hereinafter.)

As shown in FIGS. 1A and 1B, preferably the coil axis is roughly parallel with the longitudinal direction of the substrate body 10. This way, the winding part 32 can have more turns and the inductance can be increased.

When the coil 30 is formed by a conductor not covered with an insulating film, or specifically when the coil 30 is formed in a manner allowing its conductor to be exposed to the surface, preferably the structure in Example 1 is applied. This is because a coil formed this way makes it easy for dielectric breakdown to occur in the substrate body 10 between the winding part 32 and the external electrodes 50a, 50b. If the coil 30 is formed by a conductor having no insulating film on its surface, the cross-section area of the conductor can be increased by an insulating film, to lower the resistance.

Example 2

Figure 5A:
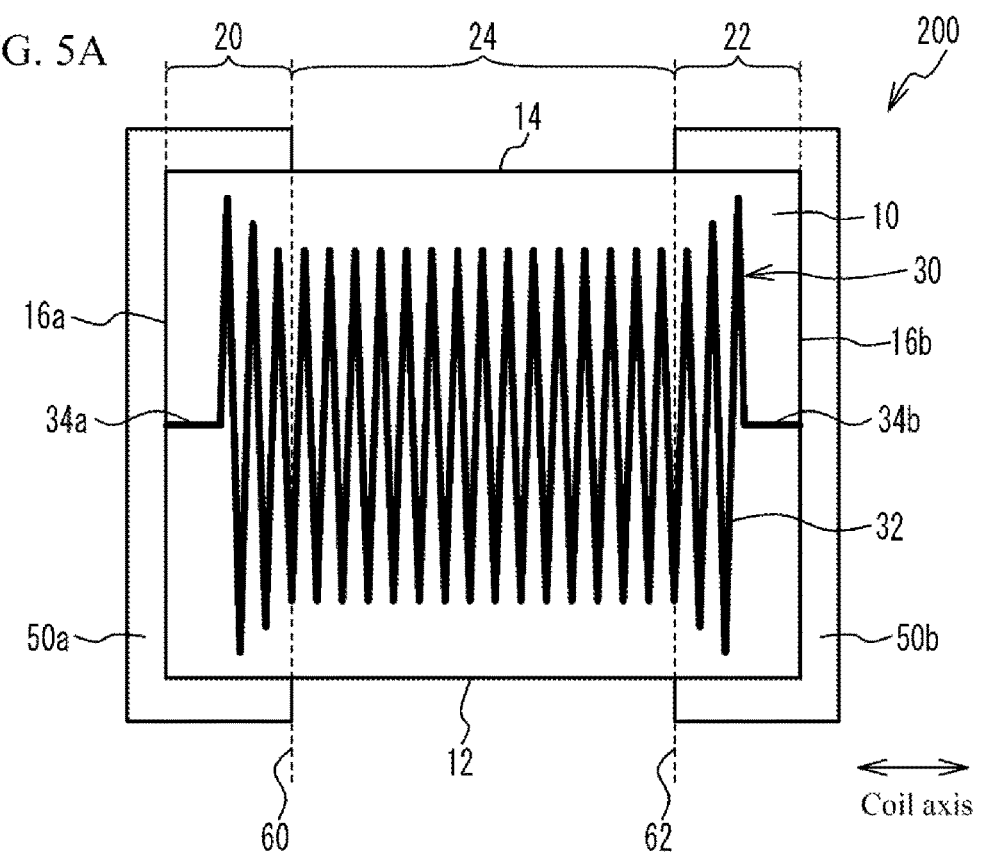
Figure 5B:
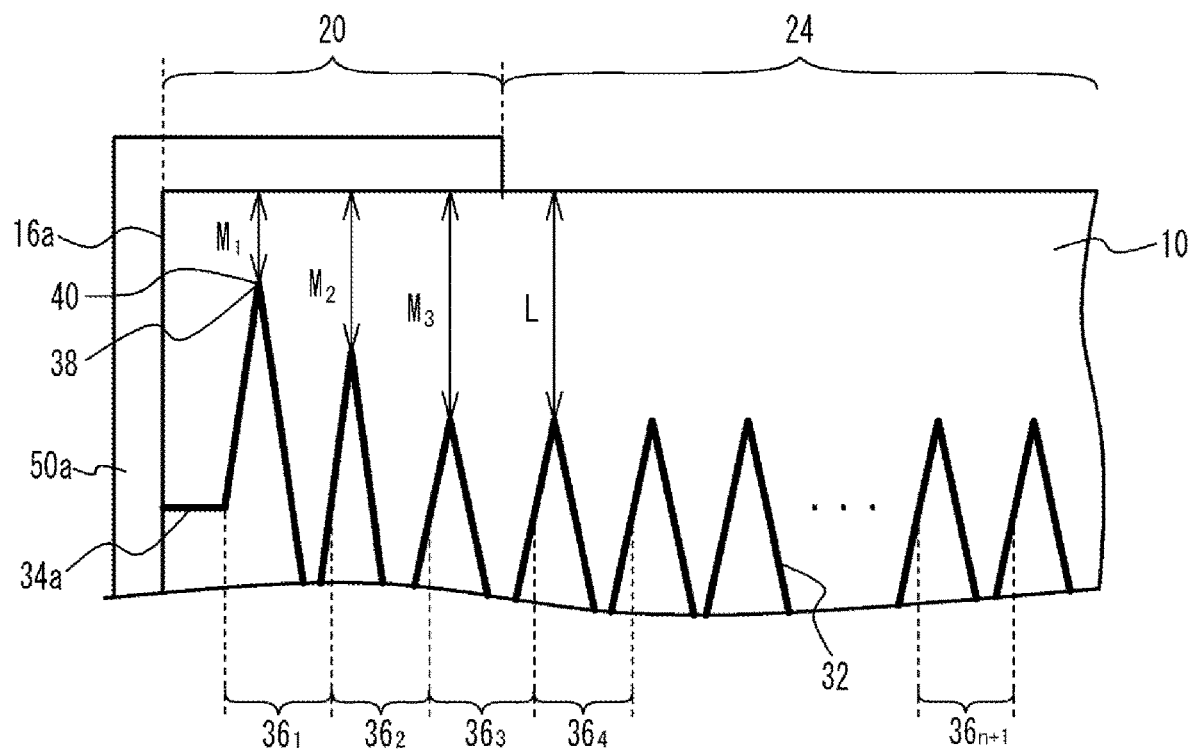
FIG. 5B is a drawing for explaining the winding part of the coil in Example 2.

FIG. 5A is a perspective side view of the coil component pertaining to Example 2, while FIG. 5B is a drawing for explaining the winding part of the coil in Example 2. It should be noted that, while the explanations in FIG. 5B are based on an example of the spacing between the portion of the external electrode 50a roughly parallel with the coil axis and the winding part 32 of the coil 30, the same applies to the spacing between the portion of the external electrode 50b roughly parallel with the coil axis and the winding part 32 of the coil 30. As shown in FIGS. 5A and 5B, the coil component 200 in Example 2 also assumes, just like in Example 1 that, among the multiple winding segments 36, the last winding segment whose shortest distance part 40 is positioned inside the region 20 is defined as the Zth winding segment. It should be noted that, in FIG. 5B, the Zth winding segment corresponds to the third winding segment (winding segment $36_3$). In this case, the shortest distance between the first winding segment (winding segment $36_1$) which is the first winding segment positioned inside the region 20, and the portion of the external electrode 50a roughly parallel with the coil axis, is defined as the shortest distance $M_1$. The shortest distance between the second winding segment (winding segment $36_2$) which is the second winding segment positioned inside the region 20, and the portion of the external electrode 50a roughly parallel with the coil axis, is defined as the shortest distance $M_2$. The shortest distance between the Zth winding segment (winding segment $36_Z$) which is the last winding segment positioned inside the region 20, and the portion of the external electrode 50a roughly parallel with the coil axis, is defined as the shortest distance $M_Z$. In this case, the shortest distance between each winding segment of the winding part 32 of the coil 30 and the portion of the external electrode 50a roughly parallel with the coil axis increases in the order of $M_1$, $M_2$ . . . , and $M_Z$. Specifically, the shortest distance between each winding segment inside the region 20 and the portion of the external electrode 50a roughly parallel with the coil axis increases as the number of the winding segment increases. Put it differently, the farther away the position of the winding segment from the end face 16a inside the region 20, the greater the shortest distance becomes between it and the portion of the external electrode 50a roughly parallel with the coil axis.

Among the multiple winding segments 36, the multiple winding segments positioned inside the region 24 are such that their shortest distances L from the surface of the substrate body 10 are roughly constant around the shortest distance $M_Z$ at the Zth winding segment. In FIG. 5B, the Zth winding segment corresponds to the third winding segment (winding segment $36_3$), so the shortest distances L are roughly constant around the shortest distance $M_3$. Among the multiple winding segments 36, for example, all winding segments except for the winding segments whose shortest distance part 40 representing the shortest distance from the external electrode 50a is positioned inside the region 20 as well as the winding segments whose shortest distance part 40 representing the shortest distance from the external electrode 50b is positioned inside the region 22, are such that their shortest distances L from the surface of the substrate body 10 are roughly constant around the shortest distance $M_Z$ at the Zth winding segment. This is because a similar relationship holds regarding the winding segment 36 of the winding part 32 of the coil 30 and the portion of the external electrode 50b roughly parallel with the coil axis. Specifically, the shortest distances L of the multiple winding segments 36 positioned inside the region 24, from the surface of the substrate body 10, correspond to the shortest distance at the winding segment, among the winding segments positioned inside the region 20 or 22, which is farthest away from the end face 16a or 16b.

Accordingly, in Example 2, the outer diameter of the winding part 32 gradually decreases in the regions 20, 22 from the lead parts 34a, 34b toward the region 24, and remains roughly constant in the region 24.

As shown in Example 2, sequentially increasing the shortest distances $M_1$ to $M_Z$ from the first winding segment to the Zth winding segment which is the last winding segment whose shortest distance part 40 is positioned inside the region 20, allows the inductance to be increased beyond the level achieved in Example 1, while preventing dielectric breakdown in the substrate body 10 between the winding part 32 and the external electrode 50a.

Also, the ease of manufacturing the coil 30 can be improved because, among the multiple winding segments 36, the multiple winding segments positioned inside the region 24 are such that their shortest distances L from the surface of the substrate body 10 are roughly constant around the shortest distance $M_Z$ at the Zth winding segment which is the last winding segment whose shortest distance part 40 is positioned inside the region 20.

It should be noted that, while Example 2 illustrated an example where the winding segments positioned inside the region 24, among the multiple winding segments 36, had roughly the same shortest distance L from the top face 14 of the substrate body 10, this is not always the case. As for the winding segments positioned inside the region 24, their shortest distances L from the top face 14 of the substrate body 10 may sequentially increase, starting from the winding segments positioned on the region 20 side and toward the winding segments positioned at the center of the coil 30. Also, their shortest distances L from the top face 14 of the substrate body 10 may sequentially decrease, starting from the winding segments positioned at the center of the coil 30 and toward the winding segments positioned on the region 22 side.

Example 3

Figure 6A:
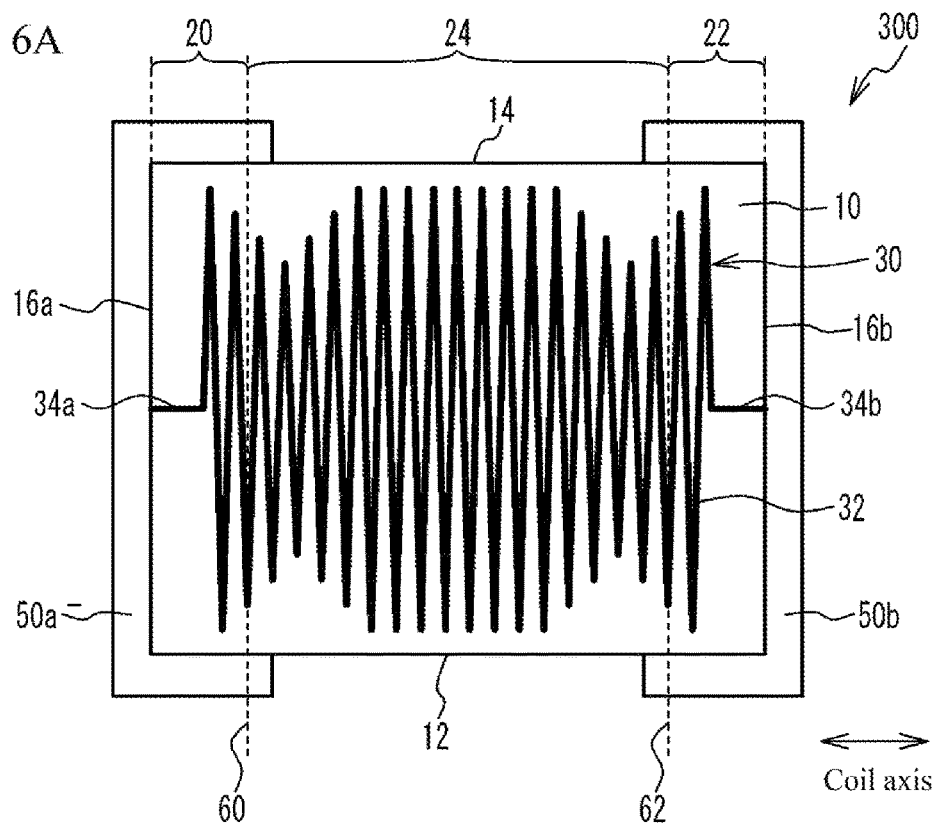
Figure 6B:
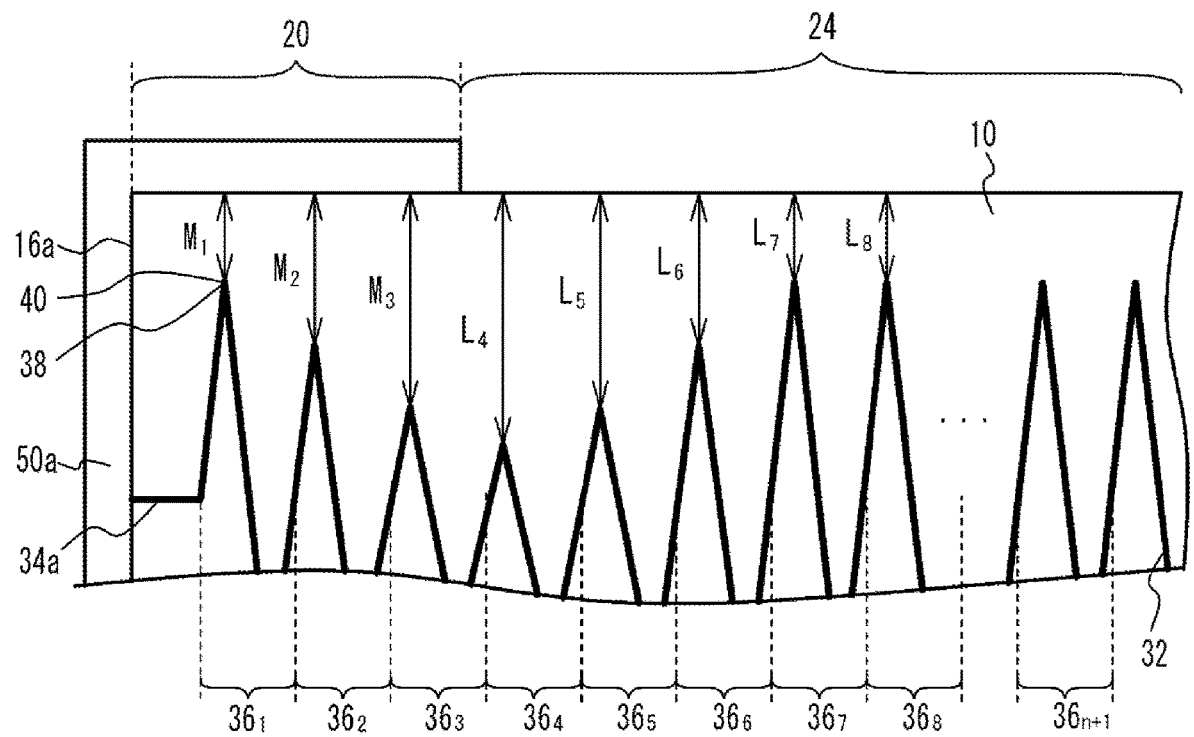
FIG. 6B is a drawing for explaining the winding part of the coil in Example 3.

FIG. 6A is a perspective side view of the coil component pertaining to Example 3, while FIG. 6B is a drawing for explaining the winding part of the coil in Example 3. As shown in FIGS. 6A and 6B, the coil component 300 in Example 3 is similar to Example 2 in that the shortest distances $M_1$ to $M_Z$, each between the shortest distance part 40 of one of the first winding segment to the Zth winding segment representing the last winding segment whose shortest distance part 40 is positioned inside the region 20, and the external electrode 50a, increase sequentially. It should be noted that, just like in FIG. 5B of Example 2, the Zth winding segment corresponds to the third winding segment (winding segment $36_3$) in FIG. 6B.

Among the multiple winding segments 36, the multiple winding segments positioned inside the region 24 are such that their shortest distances L, each from the surface of the substrate body 10, increase to or beyond the shortest distance $M_Z$ at the Zth winding segment and then decrease and eventually become roughly constant, starting from the winding segment positioned closest to the region 20 side among the multiple winding segments positioned inside the region 24, toward the winding segment positioned on the center side of the coil 30. In FIG. 6B, for example, when Z=3, Z+1=4, so the shortest distances between the surface of the substrate body 10, and the fourth winding segment (winding segment 364) to the eighth winding segment (winding segment 368) arranged in this order from the region 20 side among the multiple winding segments positioned inside the region 24, are given by $L_4$, $L_5$, $L_6$, $L_7$ and $L_8$, respectively. In this case, $L_4 \geq M_3$, $L_5 = M_3$, $L_6 = M_2$, $L_7 = M_1$, and $L_8 = M_1$ holds. The relationship of $L_4$ and $M_3$ is such that, if the distance from the interface between the regions 20, 24 to the third winding segment is equal to that to the fourth winding segment, $L_4 = M_3$ holds. It should be noted that, when the shortest distance L between the surface of the substrate body 10 and each winding segment is roughly constant, the shortest distance is not limited to $M_1$, and it may be greater or smaller than $M_1$.

As shown in Example 3, the multiple winding segments positioned inside the region 24, among the multiple winding segments 36, are such that their shortest distances L, each from the surface of the substrate body 10, increase to or beyond the shortest distance $M_Z$ at the Zth winding segment representing the last winding segment whose shortest distance part 40 is positioned inside the region 20, and then decrease and eventually become roughly constant, starting from the winding segment positioned on the region 20 side toward the winding segment positioned at the center of the coil 30. This way, the core area of the winding part 32 positioned inside the region 24 can be increased while preventing dielectric breakdown in the substrate body 10 between the winding part 32 and the external electrode 50a, and therefore the inductance can be increased.

Example 4

Figure 7:
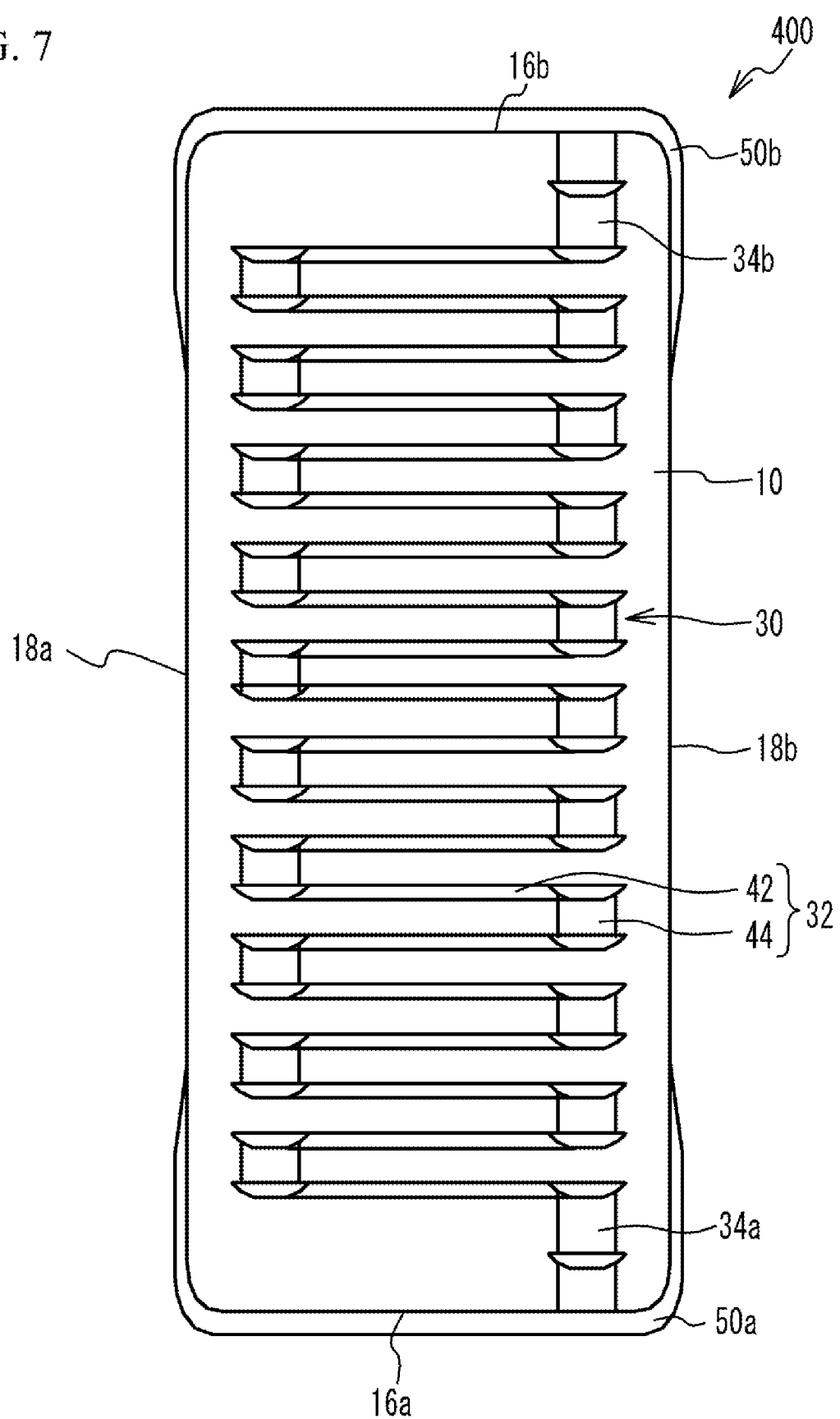
FIG. 7 is a perspective top view of the coil component pertaining to Example 4.
Figure 8:
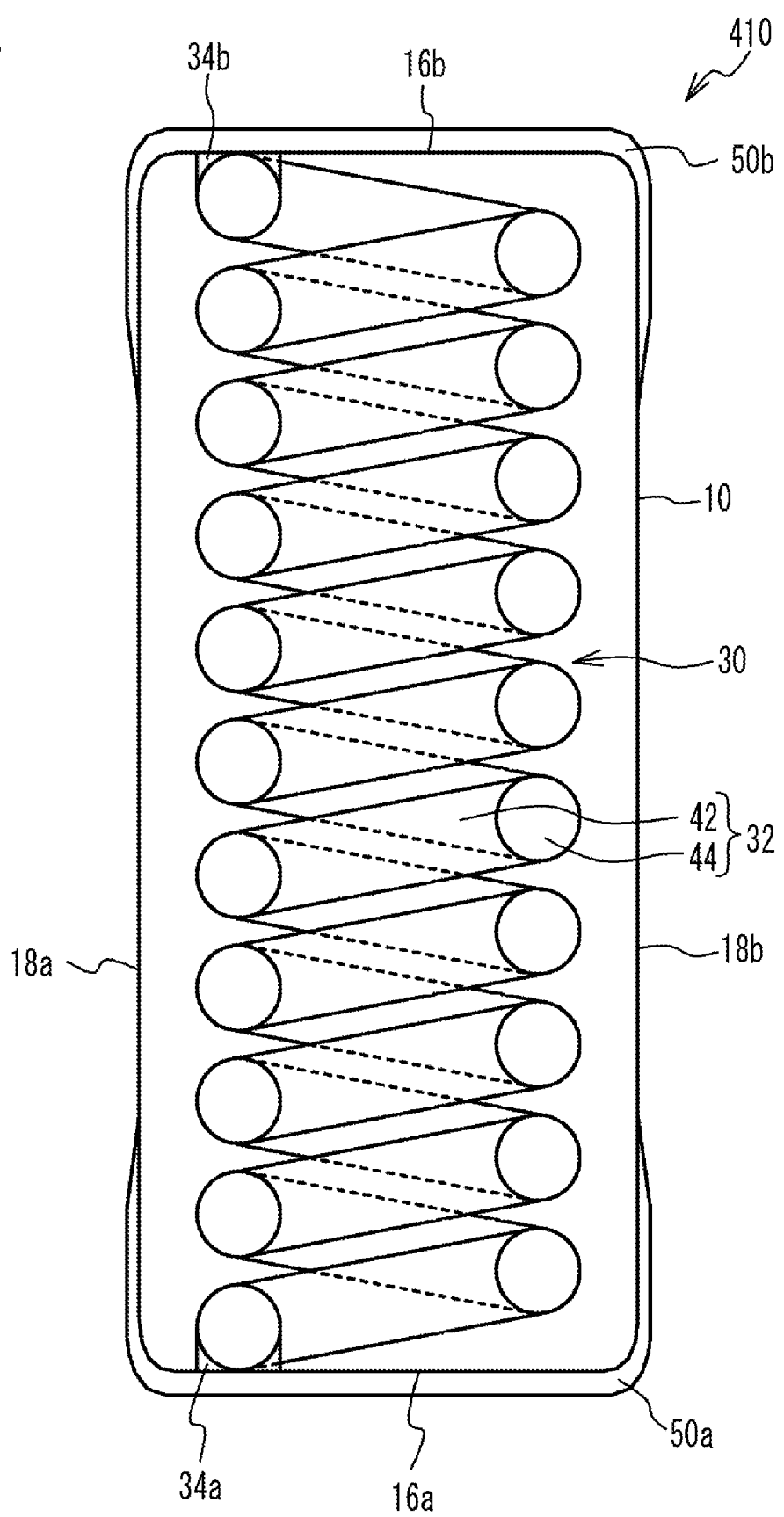
FIG. 8 is a perspective top view of the coil component pertaining to Variation Example 1 of Example 4.

FIG. 7 is a perspective top view of the coil component pertaining to Example 4. FIG. 8 is a perspective top view of the coil component pertaining to Variation Example 1 of Example 4. As shown in FIG. 7, the coil component 400 in Example 4 is a multilayer inductor which is formed by stacking, in the direction between the end faces 16a, 16b, a sheet on which conductor patterns 42 and through hole patterns 44 have been formed and a sheet on which through hole patterns 44 have been formed, to multiple layers. Interconnecting the conductor patterns 42 and through hole patterns 44 on the multiple layers of sheets forms the winding part 32 of the coil 30. As shown in FIG. 8, the coil component 410 in Variation Example 1 of Example 4 is a multilayer inductor which is formed by stacking, in the direction orthogonal to the direction between the end faces 16a, 16b, a sheet on which conductor patterns 42 and through hole patterns 44 have been formed and a sheet on which through hole patterns 44 have been formed, to multiple layers. Interconnecting the conductor patterns 42 and through hole patterns 44 on the multiple layers of sheets forms the winding part 32 of the coil 30.

While the explanations in Examples 1 to 3 were based on examples of wound coil components, they may also be laminated coil components as in Example 4 and Variation Example 1 of Example 4.

Example 5

Figure 9:
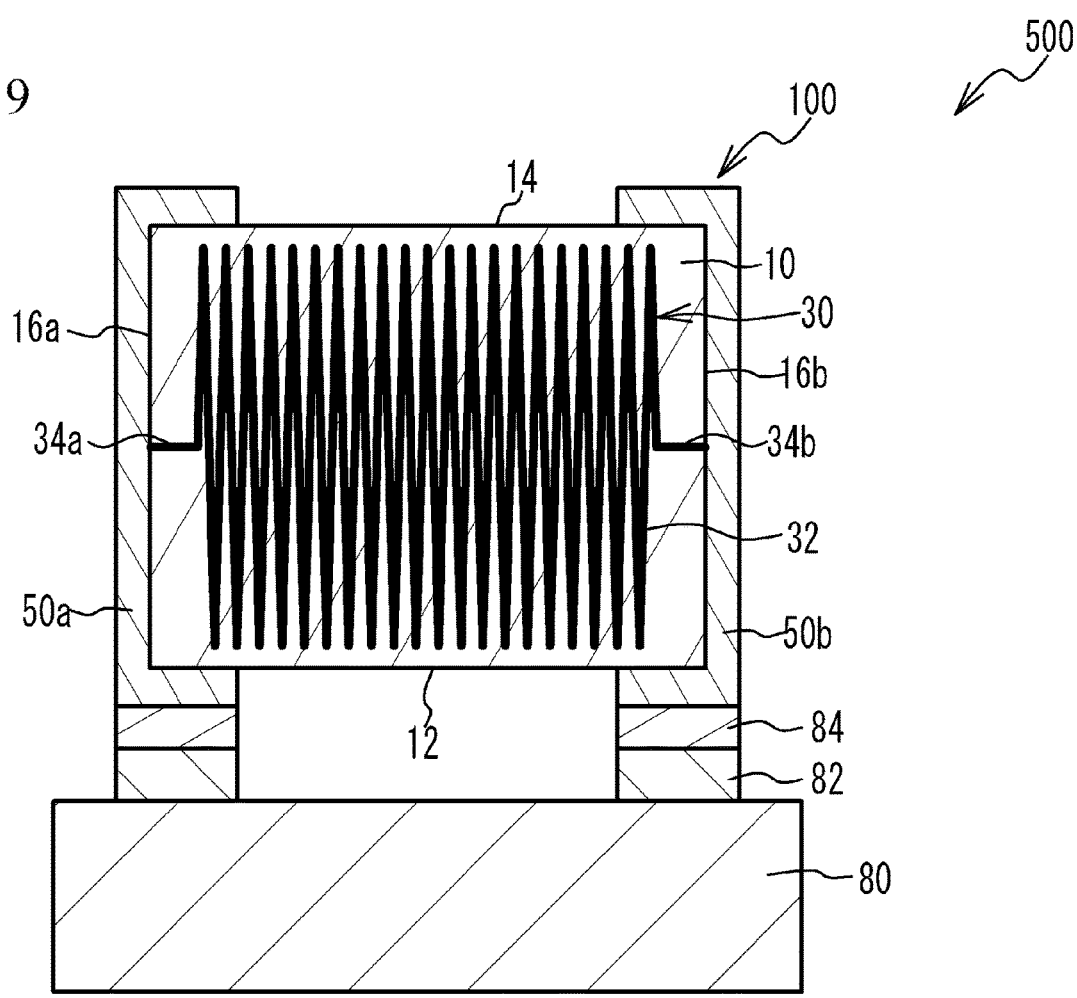
FIG. 9 is a perspective side view of the electronic device pertaining to Example 5.

FIG. 9 is a perspective side view of the electronic device pertaining to Example 5. It should be noted that, in FIG. 9, hatching is used for the purpose of illustrative clarity. As shown in FIG. 9, the electronic device 500 in Example 5 comprises a circuit board 80 and the coil component 100 in Example 1 that has been mounted on the circuit board 80. The coil component 100 is mounted on the circuit board 80 with its external electrodes 50a, 50b joined to the electrodes 82 on the circuit board 80 by a solder 84.

According to the electronic device 500 in Example 5, the coil component 100 in Example 1 is mounted on a circuit board 80. This way, an electronic device 500 having a coil component 100 resistant to dielectric breakdown in its substrate body 10 between the winding part 32 of the coil 30 and the external electrodes 50a, 50b, can be obtained. It should be noted that, while Example 5 illustrated an example where the coil component 100 in Example 1 was mounted on a circuit board 80, any of the coil components in Example 2 to Variation Example 1 of Example 4 may be mounted instead.

The foregoing described the examples of the present invention in detail; however, the present invention is not limited to these specific examples and various modifications and changes may be added so long as doing so does not deviate from the key points of the present invention as described in "What Is Claimed Is."

We claim:

1. A coil component, comprising: a coil having a winding part constituted by a conductor which is wound; a substrate body containing metal magnetic grains, which has the coil embedded therein and is shaped roughly as a rectangular solid having a first surface roughly parallel with a coil axis of the coil and a pair of surfaces opposite to each other referred to as a second surface and a third surface intersecting roughly orthogonally with the first surface and being roughly orthogonal to the coil axis; a first external electrode provided in a manner extending at least from the first surface, to the second surface, of the substrate body, and connected to the coil at the second surface; and a second external electrode provided in a manner extending at least from the first surface, to the third surface, of the substrate body, and connected to the coil at the third surface; wherein: the substrate body has: a first region defined by and sandwiched between the second surface and a plane which passes through a point of the first external electrode farthest away from the second surface and is parallel with the second surface; a second region defined by and sandwiched between the third surface and a plane which passes through a point of the second external electrode farthest away from the third surface and is parallel with the third surface; and a third region contacted with and sandwiched between the first region and the second region; and the winding part is provided in the third region, and also in the first region in which the conductor is wound by one turn or more, wherein: the winding part has multiple winding segments in a manner that a section where a number of turns is n or more but less than $(n_+1)$, as counted from a starting point on a second surface side of the substrate body, is defined as a $(n_+1)$th winding segment (n is an integer of 0 or greater); when a spacing, in a direction parallel with the coil axis, between a pair of adjacent winding segments among the multiple winding segments is given by D, and when a shortest distance between a Xth winding segment (X is an integer of 1 or greater) among the multiple winding segments and a portion of the first external electrode roughly parallel with the coil axis is given by MX, a relationship of Mx>X−D is satisfied; the conductor of the winding part is wound to roughly a same outer diameter entirely from one end of the conductor to another end of the conductor in a direction of the coil axis; and a lead part extends from the winding part linearly to the second surface roughly parallel with the coil axis and is connected to the first external electrode, wherein a length of the lead part is equal to or greater than D.

2. The coil component according to claim 1, wherein the coil axis is roughly parallel with a longitudinal direction of the substrate body.

3. The coil component according to claim 1, wherein the conductor forming the coil is not covered with an insulating material and is exposed.

4. An electronic device, comprising:
the coil component according to claim 1; and
a circuit board on which the coil component has been mounted.

5. The coil component according to claim 1, wherein the conductor in the winding part is in direct contact with the substrate body.

6. A coil component, comprising:
a coil having a winding part constituted by a conductor which is wound;
a substrate body containing metal magnetic grains, which has the coil embedded therein and is shaped roughly as a rectangular solid having a first surface roughly parallel with a coil axis of the coil and a pair of surfaces opposite to each other referred to as a second surface and a third surface intersecting roughly orthogonally with the first surface and being roughly orthogonal to the coil axis;
a first external electrode provided in a manner extending at least from the first surface, to the second surface, of the substrate body, and connected to the coil at the second surface; and
a second external electrode provided in a manner extending at least from the first surface, to the third surface, of the substrate body, and connected to the coil at the third surface; wherein:
the substrate body has: a first region defined by and sandwiched between the second surface and a plane which passes through a point of the first external electrode farthest away from the second surface and is parallel with the second surface; a second region defined by and sandwiched between the third surface and a plane which passes through a point of the second external electrode farthest away from the third surface and is parallel with the third surface; and a third region contacted with and sandwiched between the first region and the second region; and
the winding part is provided in the third region, and also in the first region in which the conductor is wound by one turn or more,
wherein:
the winding part has multiple winding segments in a manner that a section where a number of turns is n or more but less than (n+1), as counted from a starting point on a second surface side of the substrate body, is defined as a (n+1)th winding segment (n is an integer of 0 or greater);
when a spacing, in a direction parallel with the coil axis, between a pair of adjacent winding segments among the multiple winding segments is given by D, and when a shortest distance between a Xth winding segment (X is an integer of 1 or greater) among the multiple winding segments and a portion of the first external electrode roughly parallel with the coil axis is given by $M_x$, a relationship of $M_x > X \cdot D$ is satisfied; and
when the portion of each of the multiple winding segments whose distance from the portion of the first external electrode roughly parallel with the coil axis is defined as a shortest distance part, the shortest distances, each between the shortest distance part of one of the first winding segment to the last winding segment whose shortest distance part is positioned inside the region, among the multiple winding segments, and the first external electrode, increase sequentially.

7. The coil component according to claim 6, wherein the shortest distances, each between one of the multiple winding segments positioned inside the third region, among the multiple winding segments, and the surface of the substrate body, are roughly constant around the shortest distance between the shortest distance part of the last winding segment and the first external electrode.

8. The coil component according to claim 6, wherein the shortest distances, each between one of the multiple winding segments positioned inside the third region, among the multiple winding segments, and the surface of the substrate body, increase to or beyond the shortest distance between the shortest distance part of the last winding segment and the first external electrode, and then decrease and eventually become roughly constant, starting from the winding segment positioned on the first region side toward the winding segment positioned at a center.

\* \* \* \* \*

UNITED STATES PATENT AND TRADEMARK OFFICE
CERTIFICATE OF CORRECTION

PATENT NO. : 11,705,272 B2
APPLICATION NO. : 16/570744
DATED : July 18, 2023
INVENTOR(S) : Kenichiro Nogi and Yoshio Hayashide It is certified that error appears in the above-identified patent and that said Letters Patent is hereby corrected as shown below:

In the Claims

At Column 13, Line 2, in Claim 1, after the phrase "comprising:", the recitation starting with "a coil" should begin on a new line.

At Column 13, Line 3, in Claim 1, after the phrase "wound;", the recitation starting with "a substrate" should begin on a new line.

At Column 13, Line 10, in Claim 1, after the phrase "axis;", the recitation starting with "a first" should begin on a new line.

At Column 13, Line 13, in Claim 1, after the phrase "; and", the recitation starting with "a second" should begin on a new line.

At Column 13, Line 17, in Claim 1, the recitation starting with "the substrate" should begin on a new line.

At Column 13, Line 26, in Claim 1, after the phrase "; and", the recitation starting with "the winding part" should begin on a new line.

At Column 13, Line 28, in Claim 1, after the phrase "more,", the recitation starting with "wherein" should begin on a new line.

At Column 13, Line 29, in Claim 1, the recitation starting with "the winding part" should begin on a new line.

At Column 13, Line 31, in Claim 1, please delete "n.sub.+1" and insert therefor --n+1--.

At Column 13, Line 32, in Claim 1, please delete "(n.sub.+1)" and insert therefor --(n+1)--.

Signed and Sealed this
Tenth Day of October, 2023

*Katherine Kelly Vidal*
Katherine Kelly Vidal
*Director of the United States Patent and Trademark Office*

At Column 13, Line 33, in Claim 1, after the phrase "greater);", the recitation starting with "when" should begin on a new line.

At Column 13, Line 40, in Claim 1, please delete "MX" and insert therefor --M.sub.X--.

At Column 13, Line 40, in Claim 1, please delete "Mx>X-D" and insert therefor --M.sub.X>X•D--.

At Column 13, Line 41, in Claim 1, after the phrase "satisfied;", the recitation starting with "the conductor" should begin on a new line.

At Column 13, Line 44, in Claim 1, after the phrase "; and", the recitation starting with "a lead part" should begin on a new line.